(12) United States Patent
Nakabayashi

(10) Patent No.: US 6,337,238 B1
(45) Date of Patent: Jan. 8, 2002

(54) SEMICONDUCTOR DEVICE HAVING A DIELECTRIC FILM AND A FABRICATION PROCESS THEREOF

(75) Inventor: Masaaki Nakabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/256,080

(22) Filed: Feb. 24, 1999

Related U.S. Application Data

(62) Division of application No. 08/901,279, filed on Jul. 29, 1997, now Pat. No. 5,905,278.

(30) Foreign Application Priority Data

Dec. 11, 1996 (JP) .............................................. 8-331319

(51) Int. Cl.[7] ......................................... H01L 21/8242
(52) U.S. Cl. ...................... 438/240; 438/253; 438/396; 438/706; 438/720; 438/945
(58) Field of Search .................. 257/310, 295; 438/3, 240, 945, 706, 720

(56) References Cited

U.S. PATENT DOCUMENTS

| | | | | |
|---|---|---|---|---|
| 5,407,855 A | * | 4/1995 | Maniar et al. ................. | 438/3 |
| 5,478,772 A | * | 12/1995 | Fazan ........................ | 438/240 |
| 5,527,729 A | * | 6/1996 | Matsumoto et al. ........ | 438/396 |
| 5,618,746 A | * | 4/1997 | Hwang ........................... | 438/3 |
| 5,708,284 A | | 1/1998 | Onishi ........................ | 257/295 |
| 5,717,236 A | * | 2/1998 | Shinkawata ................. | 257/310 |
| 5,807,774 A | * | 9/1998 | Desu .......................... | 438/240 |
| 5,874,364 A | * | 2/1999 | Nakabayashi et al. ......... | 438/3 |
| 5,879,957 A | * | 3/1999 | Joo ............................... | 438/3 |

FOREIGN PATENT DOCUMENTS

| | | |
|---|---|---|
| JP | 06326249 B1 | 11/1994 |
| JP | 09-181081 | * 7/1997 |

* cited by examiner

Primary Examiner—Mary Wilczewski
Assistant Examiner—Toniae M. Thomas
(74) Attorney, Agent, or Firm—Armstrong, Westerman, Hattori, McLeland & Naughton LLP

(57) ABSTRACT

A semiconductor memory device includes a memory cell capacitor for storing information, wherein the memory cell capacitor includes a capacitor insulation film of a double oxide on a lower electrode. The lower electrode has a layered structure of Ir/IrO$_2$/Ir or Ru/RuO$_2$/Ru acting as a diffusion barrier of oxygen or Pb. Further, the use of a Pt—Ir alloy is disclosed for the lower electrode.

5 Claims, 14 Drawing Sheets

Ptir(100nm) / TiN(50nm) / Ti(20nm)
500°C, 30min, O$_2$

Ptir(100nm) / TiN(50nm) / Ti(20nm)
600°C, 30min, $O_2$

US 6,337,238 B1

SEMICONDUCTOR DEVICE HAVING A DIELECTRIC FILM AND A FABRICATION PROCESS THEREOF

This application is a division of prior application Ser. No. 08/901,279, filed Jul. 29, 1997 (now U.S. Pat. No. 5,905,278 issued May 5, 1999.

BACKGROUND OF THE INVENTION

The present invention generally relates to semiconductor devices and more particularly to a random access memory having a ferroelectric film (FRAM; ferroelectric random access memory) or a miniaturized dynamic random access memory (DRAM) having a high permittivity dielectric film.

With recent advancements in memory technology, particularly with regard to the art of device miniaturization, DRAMs that use a high permittivity dielectric film for the memory cell capacitor are studied intensively. Further, intensive efforts are being made also for FRAMs that use a ferroelectric film for storage of information. An FRAM stores information in the ferroelectric film in the form of polarization and has advantageous features of a non-volatile nature of information storage and a large access speed.

Conventionally, DRAMs are formed to have a dielectric film of SiN or $SiO_2$ for the capacitor dielectric film of the memory cell capacitor. With an increase of the integration density and a corresponding miniaturization of the device, however, the use of such a conventional dielectric film has caused the problem of insufficient capacitance for the memory cell capacitor due to the excessive miniaturization of the memory cell capacitor. As a DRAM stores information in the memory cell capacitor in the form of electric charges, the decrease of the capacitance of the memory cell capacitor, which occurs inevitably as a result of the device miniaturization, causes a problem of an unreliable read/write operation or an unreliable holding of the stored information.

In order to compensate for such a decrease of the memory cell capacitance, it is proposed to use a high-permittivity dielectric film for the memory cell capacitor of a DRAM. For example, the use of a double oxide film such as (Ba, Sr)$TiO_3$ (called hereinafter BST) or $SrTiO_3$ (called hereinafter STO) is studied intensively for this purpose.

Further, it should be noted that a double oxide is used also in FRAMs for a capacitor dielectric film, wherein the double oxide used in a FRAM is a ferroelectric material that shows a spontaneous polarization below a Curie temperature. For example, the use of Pb(Zn, Ti)$O_3$ (called hereinafter PZT) is studied intensively for the dielectric film of an FRAM.

As these dielectric or ferroelectric films of double oxides have a substantially different nature as compared with a silicon nitride (SiN) film or a silicon oxide ($SiO_2$) film used conventionally for the capacitor dielectric film of a DRAM, there arises various difficulties when the semiconductor memory device is fabricated to have a conventional structure.

FIG. 1 shows an example of the memory cell of a conventional FRAM that uses a ferroelectric film for the capacitor dielectric film, wherein it should be noted that FIG. 1 shows only the essential part of the device including a local interconnection pattern, while the illustration of interlayer insulation films and interconnection patterns provided further thereon is omitted for the sake of simplicity.

Referring to FIG. 1, the FRAM is constructed on a Si substrate 101 carrying a field oxide film 102, wherein the field oxide film 102 defines a memory cell region on the substrate 101 as usual. Further, the Si substrate 101 carries thereon a gate electrode 104 extending across the memory cell region, wherein a gate insulation film 103 is interposed between the substrate 101 and the gate electrode 104 in the foregoing memory cell region. Further, diffusion regions 105 and 106 are formed at both sides of the gate electrode 104 in the memory cell region as a source and a drain of the memory cell transistor.

The gate electrode 104, on the other hand, is covered by a first interlayer insulation film 107, and a bit line 108 is provided on the interlayer insulation film 107 in electrical contact with the diffusion region 105 via a contact hole formed in the interlayer insulation film 107. The bit line 108 is then covered by a second interlayer insulation film 109, on which a memory cell capacitor is formed.

As indicated in FIG. 1, the memory cell capacitor includes a lower capacitor electrode 110 provided directly on the interlayer insulation film 109, and a capacitor dielectric film 111 is provided on the lower capacitor electrode 110. Further, an upper capacitor electrode is provided on the capacitor dielectric film 111 so as to sandwich the capacitor dielectric film 111 between the lower and upper capacitor electrodes 110 and 112. A third interlayer insulation film 113 further covers the memory cell capacitor thus formed on the second interlayer insulation film 109.

The structure thus formed is provided with a via-hole extending through the interlayer insulation films 107, 109 and 113, and a local interconnection pattern 114 is provided on the interlayer insulation film 113 in electrical contact with the diffusion region 106 exposed by the via-hole and further in electrical contact with the upper capacitor electrode 112, such that the local interconnection pattern 114 connects the diffusion region 106 to the upper capacitor electrode 112 of the memory cell capacitor.

The fabrication of the FRAM of FIG. 1 may be carried out as follows.

First, the Si substrate 101 is formed with the field oxide film 102 such that the field oxide film 102 defines the memory cell region on the substrate 101. Further, a MOS transistor having the gate electrode 104 is formed in the memory cell region as the memory cell transistor of the FRAM, wherein the gate electrode 104 is insulated from the substrate 101 by the gate insulation film 103 and the MOS transistor further includes the diffusion regions 105 and 106 at both sides of the gate electrode 104.

Next, a silicon oxide film is deposited on the structure thus obtained including the gate electrode 104 as the first interlayer insulation film 107, and a contact hole is formed in the interlayer insulation film 107 so as to expose the diffusion region 105 by a well known photolithographic process After the contact hole is thus formed, a layer of WSi is deposited on the interlayer insulation film 107 including the contact hole such that the WSi layer contacts the exposed diffusion region 105 at the contact hole. By patterning the WSi layer thus formed subsequently, the bit line 108 is obtained.

Next, another silicon oxide film is deposited on the structure thus obtained, to form the second interlayer insulation film 109, and the formation of the lower capacitor electrode 110 is made further on the insulation film 109, wherein the formation of the lower capacitor electrode 110 is made by depositing a Ti film and a Pt film consecutively to form a Pt/Ti structure.

The Pt/Ti film thus formed is then patterned by an ion milling process by using a resist mask to form the lower capacitor electrode 110, and a PZT film is deposited further on the lower capacitor electrode 110 by an RF sputtering process, for example. The PZT film thus deposited is patterned by an ion milling process by using the resist mask to form the capacitor dielectric film 111. Further, a Pt film is deposited on the dielectric film 111, followed by an ion milling process to form the upper capacitor electrode 112, similarly to the lower capacitor electrode 110. Thereby, the memory cell capacitor is formed on the interlayer insulation film 109.

After the memory cell capacitor is formed as such, a silicon oxide film is deposited on the interlayer insulation film 109 as the third interlayer insulation film 113 so as to cover the memory cell capacitor and the diffusion region 106 is exposed by forming the via-hole noted before, such that the via-hole extends through the interlayer insulation films 107, 109 and 113. Further, a contact hole is formed in the interlayer insulation film 113 to expose the upper capacitor electrode 112, and a conductor layer is deposited on the interlayer insulation film 113 so as to establish an electrical contact with the diffusion region 106 at the via-hole and so as to establish an electrical contact with the upper capacitor electrode 112 at the contact hole of the interlayer insulation film 113. By patterning the conductor layer according to a photolithographic patterning process, one obtains the local interconnection pattern 114.

It should be noted that the conventional FRAM structure of FIG. 1, in which the memory cell capacitor is formed above the field oxide film 102, occupies a large area on the substrate 101 and is thus disadvantageous from a view point of increasing the integration density and hence the storage capacity of the information stored in the FRAM.

In order to eliminate the foregoing shortcoming of the conventional FRAM of FIG. 1 and to increase the integration density thereof further, there is proposed an improved structure of FRAM in FIG. 2, in which the memory cell capacitor is provided immediately above the diffusion region 106. In FIG. 2, it should be noted that those parts explained already are designated by the same reference numerals and the description thereof will be omitted.

Referring to FIG. 2, the FRAM has a structure similar too that of FIG. 1 except that a contact hole is formed through the interlayer insulation films 107 and 109 so as to expose the diffusion region 106, and the lower capacitor electrode 110 of the memory cell capacitor is connected to the diffusion region 106 via a conductive plug 115 of polysilicon or amorphous silicon filling the contact hole. In this construction, the local interconnection pattern 114 is eliminated and the upper capacitor electrode 112 is exposed at the contact hole formed in the third interlayer insulation film 113.

In the FRAM of FIG. 2, the lower capacitor electrode 110 of the memory cell capacitor has preferably a Pt/Ta structure including a stacking of a lower Ta layer and an upper Pt layer, for preventing a diffusion of Si from the conductive plug 115 to the PZT film 111 across the lower capacitor electrode 110. It should be noted that the Si atoms thus penetrated into the PZT film 111 would form an oxide film at the interface between the lower capacitor electrode 110 and the PZT film 111 as a result of a reaction with the oxygen atoms contained in the PZT film 111. By using the foregoing Pt/Ta structure for the lower capacitor electrode 110, the Ta layer acts as an effective diffusion barrier against Si, and the problem of diffusion of Si is successfully eliminated.

In relation to the diffusion barrier, it should be noted that the conventionally used Ti layer is found to be not effective for interrupting the diffusion of Si from the plug 115 to the lower capacitor electrode 110. Further, the use of a Ti layer in the lower capacitor electrode 110 causes the problem of diffusion of Pb and oxygen atoms from the PZT film 111 to the lower capacitor electrode 110 at the time of the RF sputtering process used for forming the PZT film 111. It should be noted that the RF sputter deposition of the PZT film 111 is conducted under an oxidizing atmosphere that contains $O_2$. A similar problem of oxygen diffusion occurs also when applying an annealing process to the PZT film 111 after a formation thereof. It should be noted that such an annealing process is essential for improving the quality of the PZT film 111 and has to be conducted in an oxidizing atmosphere, while a material such as Pt or Ti does not function as an effective diffusion barrier against oxygen atoms. Thus, the oxygen atoms readily reach the conductive plug 115 underneath the electrode 110 and cause an extensive formation of silicon oxide at the interface between the plug 115 and the electrode 110. When this occurs, there is a substantial risk that the ohmic contact between the electrode 110 and the conductive plug 115 is lost.

Further, the diffusion of Pb from the PZT film 111 across the lower capacitor electrode 110 of the Pt/Ti structure causes a compositional shift in the PZT film 111, and there is a possibility that the PZT film 111 may loose its ferroelectricity or high permittivity, which are essential for the operation of the FRAM. Further, such Pb atoms thus diffused away from the PZT film 111 tend to form PbO at the interface between the Pt layer and the Ti layer in the lower capacitor electrode 110 or at the interface between the electrode 110 and the underlying interlayer insulation film 109. When such a PbO layer is formed, there is a possibility that the film above the PO layer may scale off.

When forming a BST film for the capacitor dielectric film 111 in place of the PZT film to form a DRAM, on the other hand, a substrate temperature of about 500° C. is required when a sputtering process is employed. When the BST film is formed by a CVD process, on the other hand, a substrate temperature of about 600° C. is required. It should be noted that such a high substrate temperature is required in order to achieve a high permittivity for the deposited BST film. During such a deposition process of the BST film, an oxidizing atmosphere is employed similarly to the case of depositing a PZT film. Thus, there occurs the same problem of diffusion of the oxygen atoms through the lower capacitor electrode 110 when the lower capacitor electrode 110 has the PT/Ti structure. In this case, the formation of a silicon oxide film occurs at the interface between the conductive plug 115 and the lower capacitor electrode 110. Thereby, the ohmic contact to the memory cell capacitor is no longer guaranteed.

When the lower capacitor electrode 110 has the Pt/Ta structure, on the other hand, the diffusion of the oxygen atoms is interrupted effectively at the Ta barrier. However, the use of a Ta barrier causes a problem of formation of $Ta_2O_5$ in the lower capacitor electrode 110 at the interface between the Pt layer and the Ta barrier. It should be noted that the Pt layer of the electrode 110 contacting directly the PZT film or the BST film 111 allows a substantially free passage of the oxygen atoms therethrough, and there tends to occur an accumulation of the oxygen atoms thus diffused at the interface between the Ta layer and the Pt layer in the electrode 110.

When such a formation of $Ta_2O_5$ occurs in the lower capacitor electrode 110, the memory cell capacitor actually forms a stacked structure in which the Ta barrier layer and the Pt electrode layer sandwich a $Ta_2O_5$ layer therebetween, and the BST or PZT film 111 and the upper capacitor electrode layer 112 are stacked consecutively on the Pt electrode layer. Thereby, the memory cell capacitor includes two capacitors connected in series, one including the $Ta_2O_5$ layer as the capacitor dielectric film and the other including the BST or the PZT film 111 as the capacitor dielectric film. As $Ta_2O_5$ has a permittivity substantially smaller than the permittivity of BST or PZT, the memory cell capacitor having such a series connection structure suffers from the problem of reduced memory cell capacitance. This problem becomes particularly acute when the structure of FIG. 2 is used to form a DRAM.

SUMMARY OF THE INVENTION

Accordingly, it is a general object of the present invention to provide a novel and useful semiconductor memory device and a fabrication process thereof wherein the foregoing problems are eliminated.

Another and more specific object of the present invention is to provide a semiconductor memory device including a double oxide film in contact with a conductive film wherein the diffusion of elements from the double oxide film to the conductive film is minimized.

Another object of the present invention is to provide a semiconductor memory device, comprising:

a substrate;

a MIS transistor formed on said substrate, said MIS transistor including a gate electrode connected to a word line and first and second diffusion regions formed in said substrate at both sides of said gate electrode;

a bit line connected to said first diffusion region;

an interlayer insulation film provided on said substrate so as to cover said MIS transistor;

a contact hole provided in said interlayer insulation film so as to expose said second diffusion region;

a conductive region filling said contact hole; and the capacitor provided on said interlayer insulation film in electrical contact with said conductive region;

said capacitor including: a lower electrode in contact with said conductive region; a capacitor dielectric film provided on said lower electrode; and an upper electrode provided on said capacitor dielectric film;

said lower electrode including: a first layer of Ir provided in electrical contact with said conductive region; and a second layer of $IrO_2$ formed on said first layer.

Another object of the present invention is to provide a method of fabricating a semiconductor memory device, comprising the steps of:

forming a MIS transistor on a substrate such that said MIS transistor includes a gate electrode connected to a word line and first and second diffusion regions formed in said substrate at both sides of said gate electrode and such that said first diffusion region is connected to a bit line;

providing an interlayer insulation film on said substrate so as to cover said MIS transistor;

forming a contact hole in said interlayer insulation film so as to expose said second diffusion region;

filling said contact hole by a conductive plug;

depositing consecutively a layer of Ir and a layer of $IrO_2$ on said interlayer insulation film so as to cover said conductive plug;

patterning said Ir layer and said $IrO_2$ layer to form a lower electrode pattern;

depositing an insulation film on said lower electrode pattern;

patterning said insulation film to form a capacitor insulation film;

depositing a conductor layer on said capacitor insulation film; and patterning said conductor layer to form an upper electrode.

Another object of the present invention is to provide a method of fabricating a semiconductor memory device according to the immediately above method wherein said step of patterning said lower electrode pattern is conducted by using a mask pattern of Pt.

According to the present invention, it is possible to eliminate the diffusion of oxygen atoms or the diffusion of Pb atoms in the capacitor insulation film to the conductive plug through the lower electrode pattern, by using an $IrO_2$ layer which acts as an effective diffusion barrier against these atoms.

Another object of the present invention is to provide a semiconductor memory device, comprising:

a substrate;

a metal insulator semiconductor transistor formed on said substrate, said metal-insulator-semiconductor transistor including a gate electrode connected to a word line and first and second diffusion regions formed in said substrate at both sides of said gate electrode;

a bit line connected to said first diffusion region;

an interlayer insulation film provided on said substrate so as to cover said metal-insulator-semiconductor transistor;

a contact hole provided in said interlayer insulation film so as to expose said second diffusion region;

a conductive region filling said contact hole; and a memory capacitor provided on said interlayer insulation film in electrical contact with said conductive region;

said memory capacitor including: a lower electrode in contact with said conductive region; a capacitor insulation film provided on said lower electrode; and an upper electrode provided on said capacitor insulation film;

said lower electrode including: a first layer of Ru provided in electrical contact with said conductive region; and a second layer of $RuO_2$ formed on said first layer.

Another object of the present invention is to provide a method of fabricating a semiconductor memory device, comprising the steps of:

forming a metal-insulator-semiconductor transistor on a substrate such that said metal-insulator-semiconductor transistor includes a gate electrode connected to a word line and first and second diffusion regions formed in said substrate at both sides of said gate electrode and such that said first diffusion region is connected to a bit line;

providing an interlayer insulation film on said substrate so as to cover said metal-insulator- semiconductor transistor;

forming a contact hole in said interlayer insulation film so as to expose said second diffusion region;

filling said contact hole by a conductive plug;

depositing consecutively a layer of Ru and a layer of $RuO_2$ on said interlayer insulation film so as to cover said conductive plug;

patterning said Ru layer and said $RuO_2$ layer to form a lower electrode pattern;

depositing an insulation film on said lower electrode pattern;

patterning said insulation film to form a capacitor insulation film;

depositing a conductor layer on said capacitor insulation film; and patterning said conductor layer to form an upper electrode.

According to the present invention, it is possible to pattern the lower electrode pattern by a conventional dry etching process conducted in an oxidizing atmosphere, rather than employing an ion milling process. Further, by using a Pt mask pattern at the time of the dry etching process, it is possible to eliminate the process of removing the mask pattern after the lower electrode pattern is formed. Further, the use of the Pt mask pattern successfully eliminates the problem of roughening of the surface of the lower electrode pattern that would occur when an oxide mask is used in place thereof. The lower electrode pattern of the $RuO_2/Ru$ structure successfully blocks the diffusion of oxygen therethrough.

Another object of the present invention is to provide a semiconductor memory device, comprising:

a substrate;

a metal-insulator semiconductor transistor formed on said substrate, said metal-insulator-semiconductor transistor including a gate electrode connected to a word line and first and second diffusion regions formed in said substrate at both sides of said gate electrode;

a bit line connected to said first diffusion region;

an interlayer insulation film provided on said substrate so as to cover said metal-insulator-semiconductor transistor;

a contact hole provided in said interlayer insulation film so as to expose said second diffusion region;

a conductive region filling said contact hole; and a memory capacitor provided on said interlayer insulation film in electrical contact with said conductive region;

said memory capacitor including: a lower electrode in contact with said conductive region; a capacitor insulation film provided on said lower electrode; and an upper electrode provided on said capacitor insulation film;

said lower electrode comprising an alloy of Pt and Ir.

According to the present invention, the consumption of Ir in the device fabrication process is reduced, by using an alloy film of Pt—Ir. By using the Pt—Ir alloy in direct contact with the capacitor insulation film of a double oxide such as PZT, a concentration of Ir occurs at the interface between the capacitor insulation film and the lower electrode pattern, and there is formed a layer of $IrO_2$ at such as interface as a result of the reaction between the accumulated Ir and oxygen in the capacitor insulation film. The $IrO_2$ layer thus formed acts as an efficient diffusion barrier of oxygen as well as Pb in the capacitor insulation film.

Other objects and further features of the present invention will become apparent from the following detailed description when read in conjunction with the attached drawings.

DETAILED DESCRIPTION OF THE PREFERRED EMBODIMENTS

[Principle]

Figure 1:
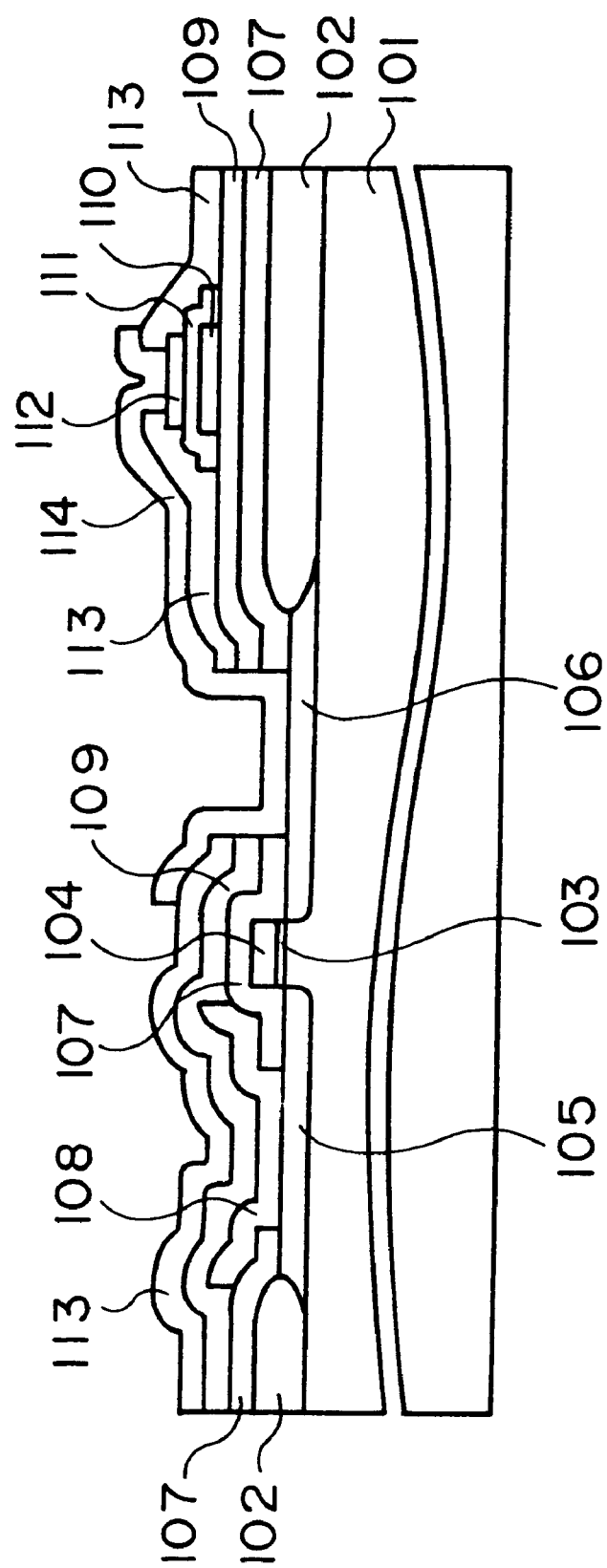
FIG. 1 is a diagram showing the construction of a conventional RAM.
Figure 2:
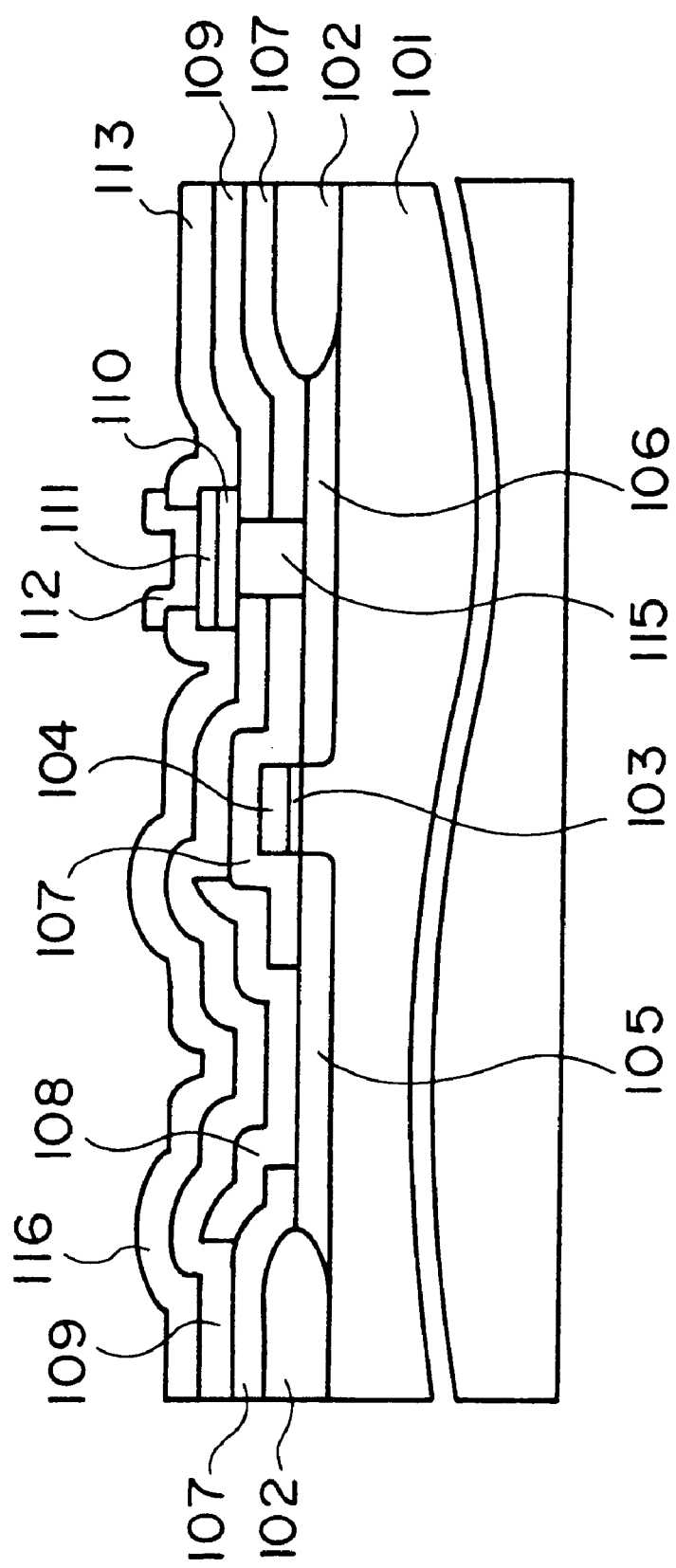
FIG. 2 is a diagram showing the construction of another conventional FRAM.
Figure 3:
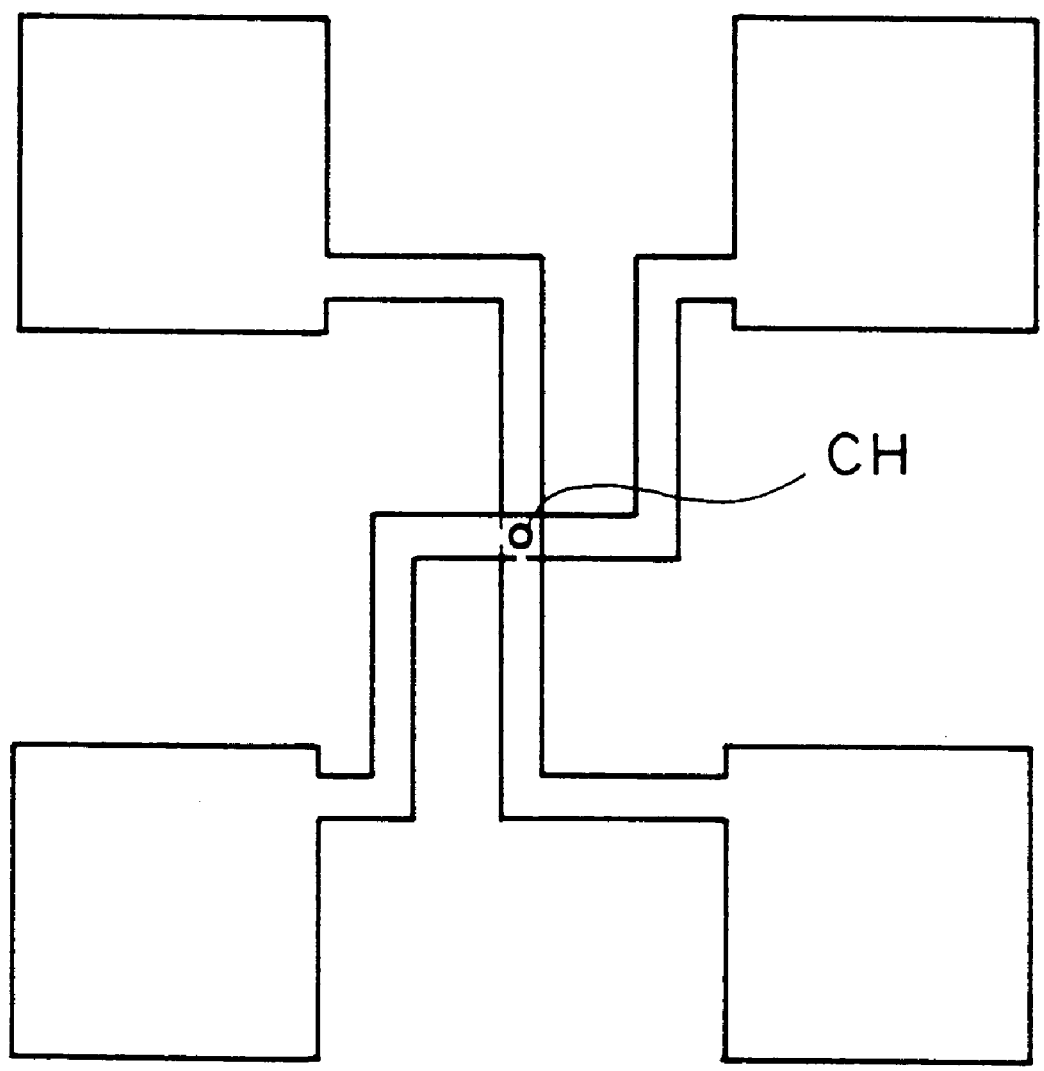
FIG. 3 is a diagram showing the construction of a Kelvin contact used for explaining the principle of the present invention.

First, the principle of the present invention will be explained for a first aspect with reference to FIG. 3 showing the construction of a Kelvin contact, which was used in the experimental investigation conducted by the inventor of the present invention for evaluating the oxygen diffusion in a stacked electrode system having an $Ir/IrO_2/Ir$ structure.

Referring to FIG. 3, the Kelvin contact is formed on a Si substrate of the n-type and includes a U-shaped diffusion region of the $n^+$-type formed in the Si substrate, with electrode pads D1 and D2 formed at both opposing ends thereof. The Si substrate used in the experiment has a specific resistance of 15 $\bar{o}$cm and is covered by an insulation film of $SiO_2$ formed by a CVD process, and a small circular contact hole CH is formed in the insulation film for exposing a part of the U-shaped diffusion region. The $n^+$-type diffusion region is formed by an ion implantation of P under an acceleration voltage of 50 keV with a dose of $5 \times 10^{13}$ cm$^{-1}$, followed by a thermal annealing process conducted in an $N_2$ atmosphere at 900° C. for 20 minutes.

The contact hole CH used in the experiment has a diameter of 0.72 Im and is filled by a conductive plug having a layered structure including a lowermost Ti layer having a thickness of 20 nm, and an Ir layer is formed on the Ti layer with a thickness of 20 nm. Further, an $IrO_2$ layer is formed on the Ir layer with a thickness of 100–200 nm. Further, an upper electrode pattern of Ir is formed on the $SiO_2$ film to have a U-shaped form with a thickness of 50 nm, such that a part of the upper electrode pattern covers the foregoing contact hole CH. The upper electrode pattern thus formed includes electrode pads $N_1$ and $N_2$ at both opposing ends thereof.

The contact structure thus formed in the contact hole CH is subjected to a thermal annealing process at 600° C. while flowing $O_2$ with a flow rate of 5 SLM (standard liter per minute) under an ordinary pressure, and a current I flowing between the electrode pads D2 and N1 is measured while applying a voltage V across the electrode pads D1 and N2. In one series of the experiment, the annealing was made for 10 seconds, while in another series of the experiment, the annealing was made for 60 seconds.

Figure 4:
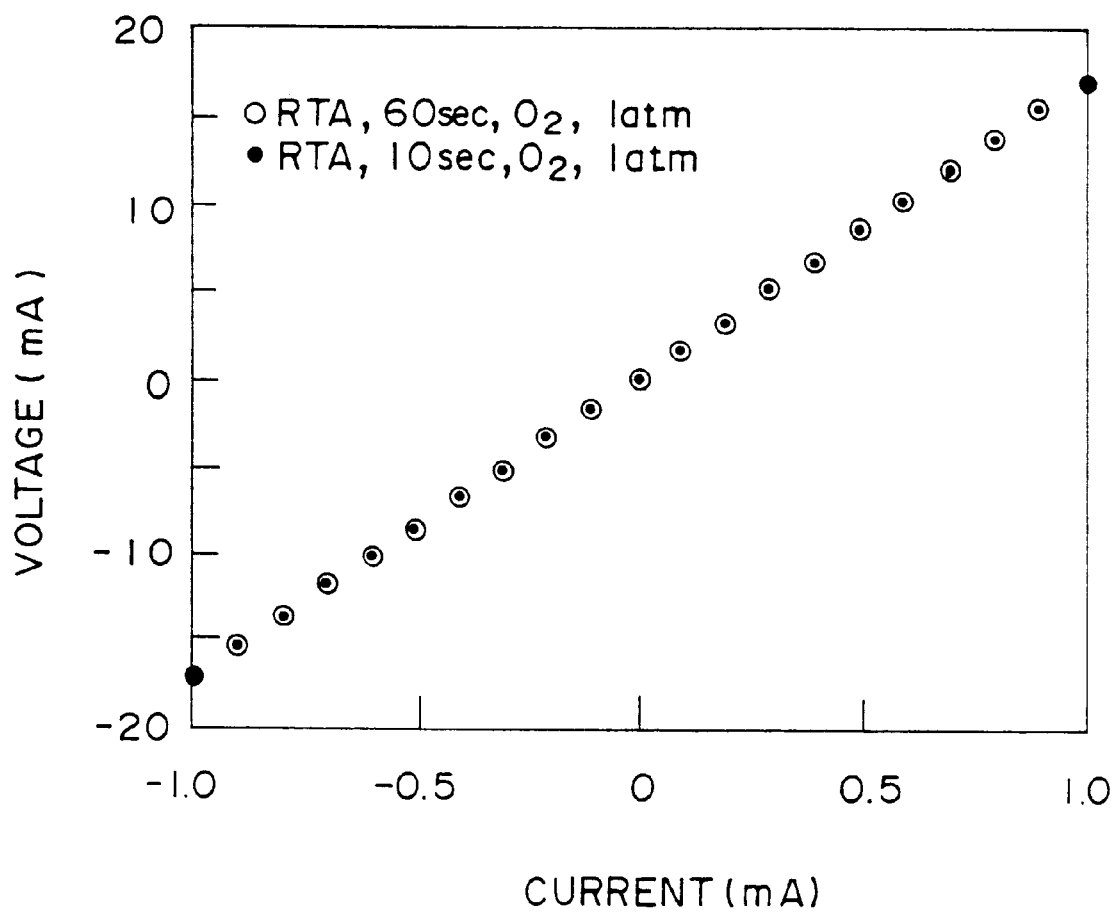
FIG. 4 is a diagram showing an I-V characteristic of a Kelvin contact of FIG. 3.

FIG. 4 shows the I-V characteristic of the Kelvin contact of FIG. 3 thus annealed, wherein the open circles represent the result of the first series experiment in which the annealing time was only 10 seconds, while the small dots represent the result of the second series experiment in which the annealing time was 60 seconds.

Referring to FIG. 4, it will be noted that both the first series experiment and the second series experiment provide a substantially identical result showing a linear relationship between the current I and the applied voltage V. In other words, the Kelvin contact of FIG. 3 shows an excellent ohmic contact even after the foregoing annealing process conducted in oxidizing atmosphere. Further, it should be noted that the duration in which the annealing is made does not affect the I-V characteristic of the contact. The result of this indicates that the oxygen diffusion into the Si substrate is effectively prevented by providing the stacked structure of Ir and $IrO_2$ in the contact hole CH.

In a second aspect of the present invention, the inventor of the present invention conducted an extensive experimental investigation for evaluating the diffusion of oxygen through a Pt—Ir alloy provided on a Si substrate.

In the experiment, a Ti film was deposited on a Si wafer by a sputtering process with a thickness of 20 nm, followed by a deposition of a TiN film with a thickness of 50 nm as usual. Further, an alloy of Pt—Ir containing Ir with 10 wt % was deposited on the TiN film with a thickness of 100 nm. The structure thus obtained was then annealed in an oxidizing atmosphere at the temperatures of 400° C., 500° C. and 600° C. under an ordinary pressure, wherein the annealing time was 30 minutes for each of the experiments.

Figure 5:
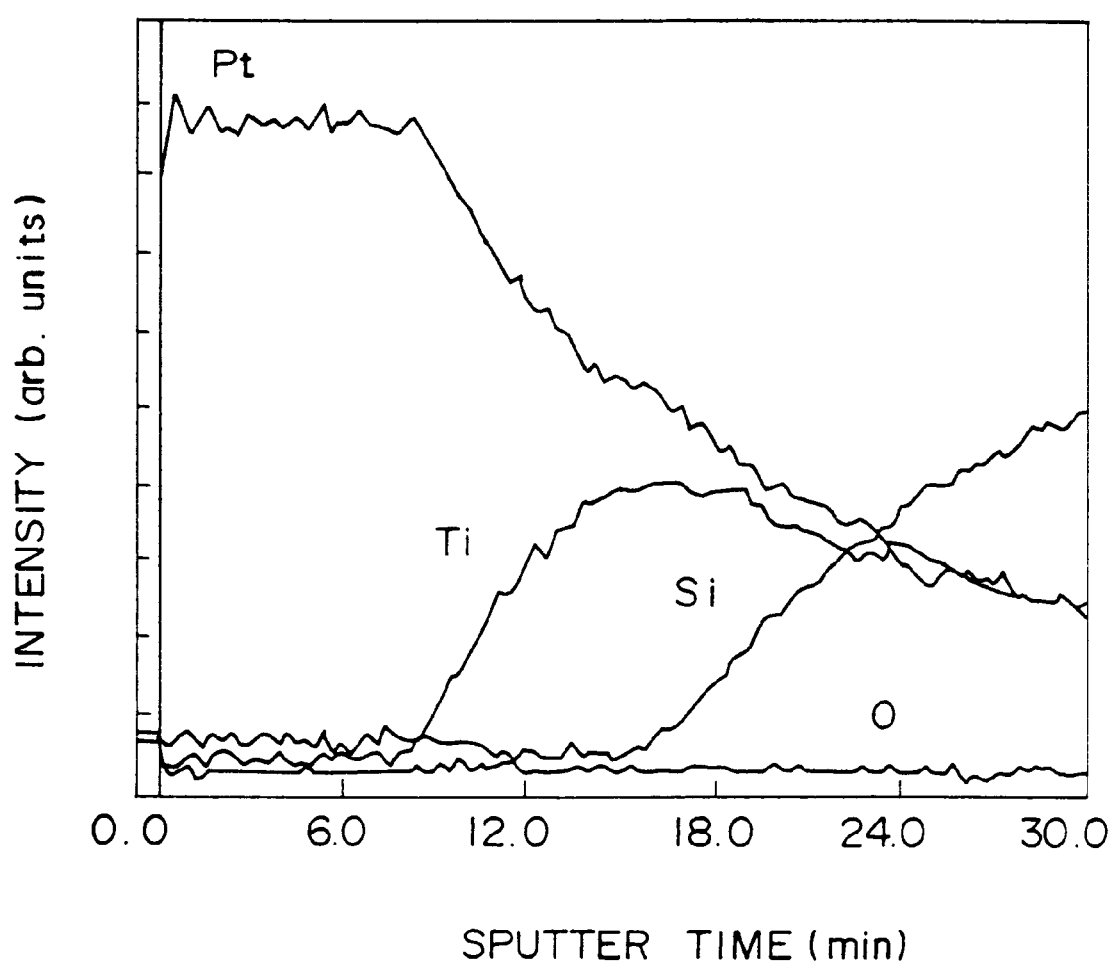
FIG. 5 is a diagram showing the result of Auger spectroscopy conducted on a layered contact structure.
Figure 6:
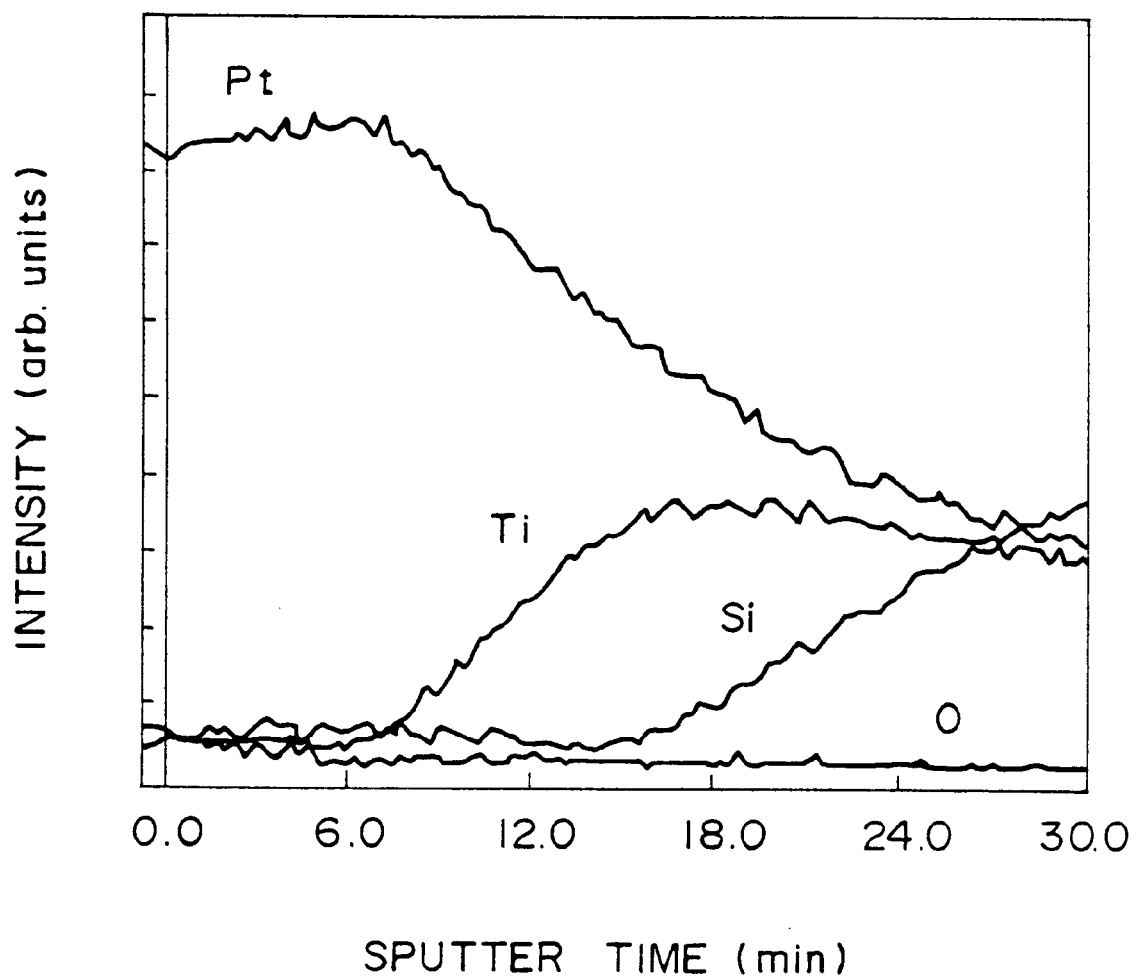
FIG. 6 is another diagram showing the result of Auger spectroscopy conducted on a layered contact structure.
Figure 7:
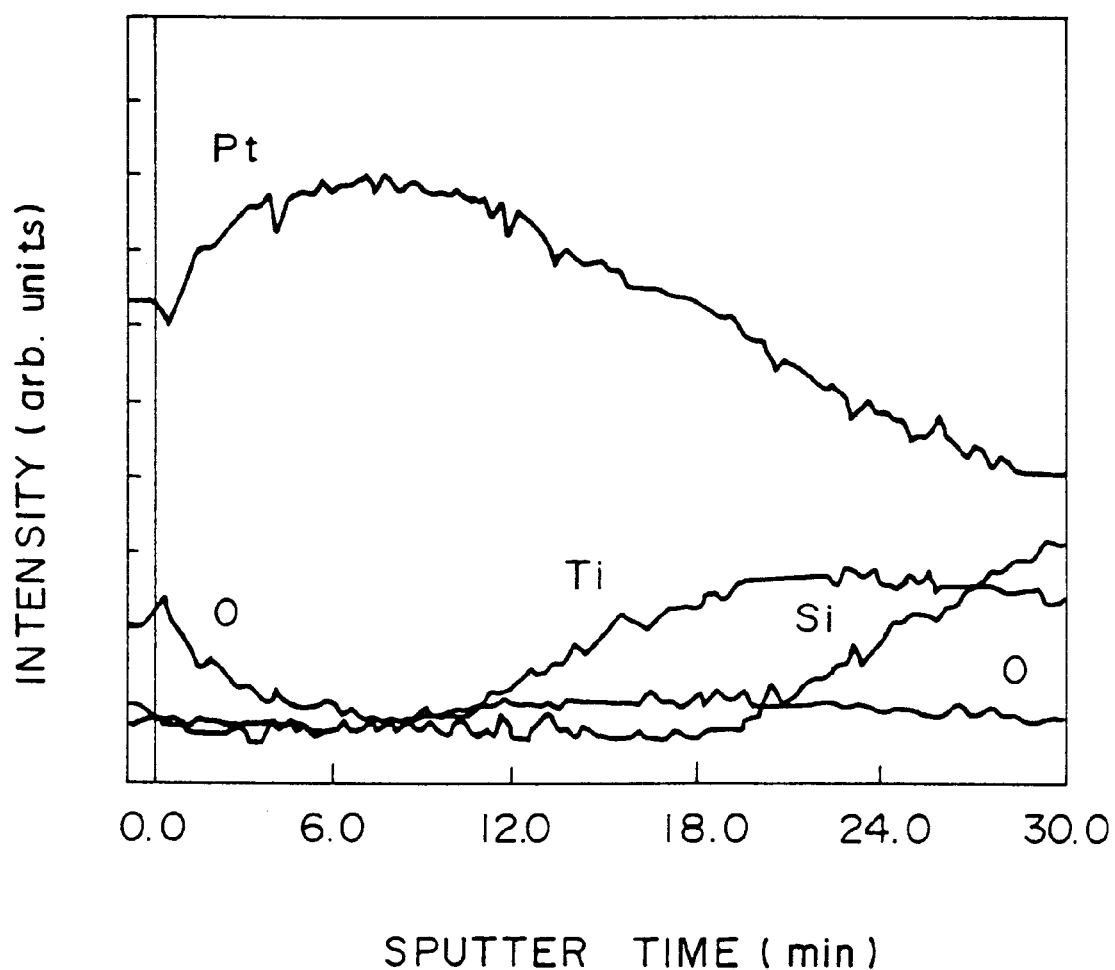
FIG. 7 is a further diagram showing the result of Auger spectroscopy conducted on a layered contact structure.

FIGS. 5–7 show the depth profile of various elements in the annealed structure obtained as a result of Auger electron spectroscopy (AES).

Referring to FIGS. 5 and 6, it will be noted that the content of the oxygen atoms is substantially below the detection limit of the Auger spectroscopy throughout the stacked structure of Pt—Ir/TiN/Ti as long as the annealing is made at the temperature of 400° C. or 500° C. Even when the annealing temperature is raised to 600° C., the concentration of the oxygen atoms increases only slightly at the surface, while the concentration level is still below the detection limit inside the stacked structure as indicated clearly in FIG. 7.

The discovery of the relationship of FIGS. 5–7 indicates that the diffusion of the oxygen atoms can be effectively interrupted by interposing a Pt—Ir alloy in the diffusion path of the oxygen atoms. Further, the experiments conducted for various compositions of the Pt—Ir alloy indicate that the desired function of the diffusion barrier is obtained for the Pt—Ir alloy when the Ir content is set to be 10 wt % or more. In view of the limited availability of Ir resources on the Earth, the practical Ir content in the Pt—Ir alloy may be in the range between 10–50 wt %, while the preferred content of Ir is thought to be about 10 wt %.

[First Embodiment]

FIGS. 8A–8H show the fabrication process of an FRAM according to a first embodiment of the present invention.

Figure 8A:
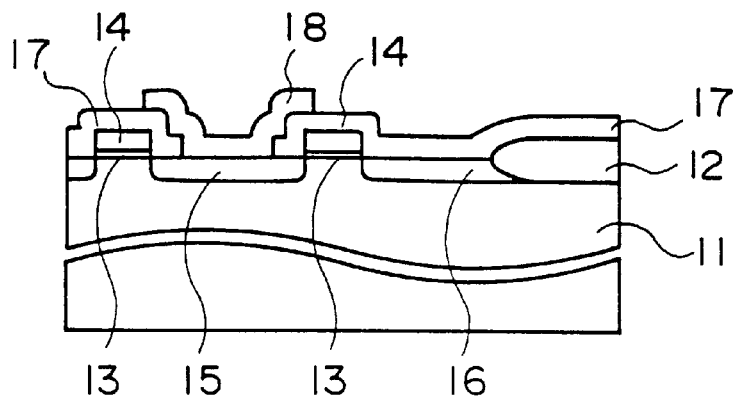
FIGS. 8A–8H are diagrams showing the fabrication process of an FRAM according to a first embodiment of the present invention.

Referring to FIG. 8A, a memory cell region is defined on a p-type Si substrate 11 by a field oxide film 12 formed by a well-known process. Further, a gate insulation film 13 is formed on the Si substrate 11 so as to cover the memory cell region, and a gate electrode 14 is provided on the gate insulation film 13 as usual in a MOS transistor. The gate electrode 14 extends across the memory cell region as a part of the word line. Further, diffusion regions 15 and 16 of the n-type are formed in the substrate 11 at both sides of the gate electrode by using the gate electrode 14 as a self-aligned mask.

After the MOS transistor is formed as such, a silicon oxide film 17 is deposited on the substrate 11 so as to bury the gate electrode 14, and a contact hole is formed in the silicon oxide film 17 by a well known photolithographic process such that the diffusion region 15 is exposed. After the diffusion region 15 is exposed, a WSi film is deposited on the silicon oxide film 17 including the foregoing contact hole such that the WSi film contacts the exposed diffusion region 15 at the contact hole. By patterning the WSi film thus deposited, a bit line 18 is obtained as indicated in FIG. 8A.

Figure 8B:
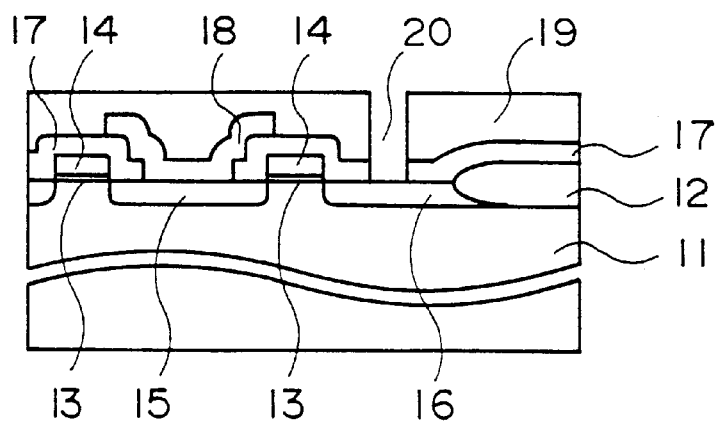

Next, in the step of FIG. 8B, a further insulation film 19, which may be a silicon oxide film, is deposited on the structure of FIG. 8A as an is interlayer insulation film, followed by a planarization process conducted by a CMP (chemical mechanical polishing) process. Of course, the planarization process may be conducted by other suitable methods such as an etch-back process in which a dry etching process is applied to the overall surface of the silicon oxide film 19 uniformly. While such a planarization process may be preferable in view point of further photolithographic processes, the planarization process may be omitted if possible or appropriate.

After the planarization of the silicon oxide film 19, a deep via-hole (contact hole) 20 is formed in the silicon oxide film 19 by a high-resolution photolithographic process such that the diffusion region 16 is exposed at the bottom of the contact hole 20. It should be noted that the planarization of the silicon oxide film 19 is preferable in such a high-resolution photolithography of the contact hole 20.

Figure 8C:
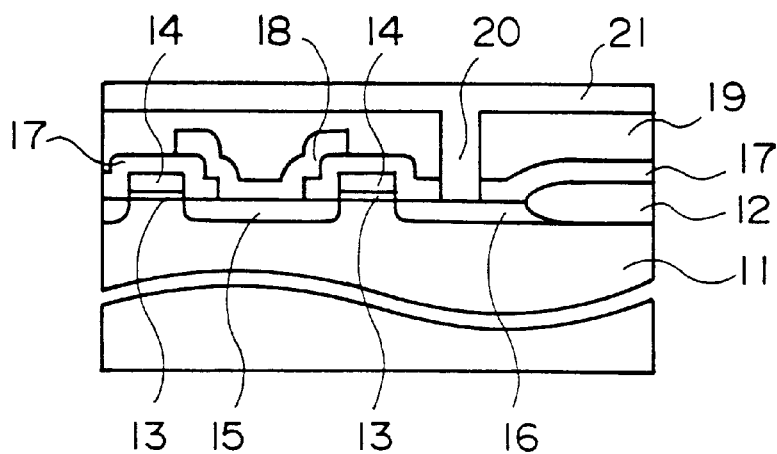

Next, in the step of FIG. 8C, a CVD process is employed for depositing an amorphous silicon film 21 on the structure of FIG. 8B, such that the amorphous silicon film 21 fills the contact hole 20. It should be noted that the amorphous silicon film 21 contains P and is doped to the $n^+$-type.

Figure 8D:
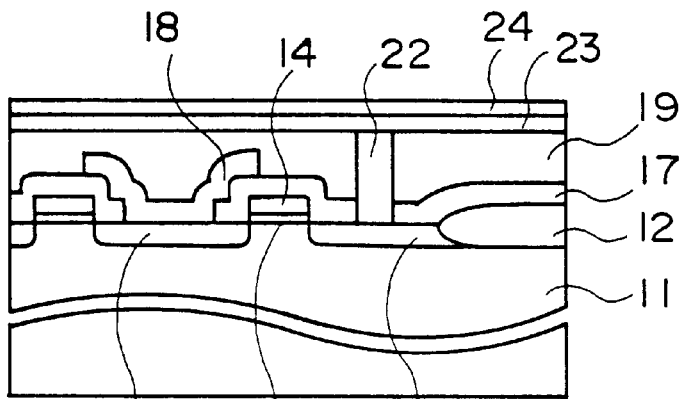

In the step of FIG. 8D, a dry etching process is applied to the amorphous silicon film 21 uniformly, until the top surface of the silicon oxide film 19 is exposed. Thereby, a conductive plug 22 of amorphous silicon or polysilicon is formed in the contact hole 20 such that the conductive plug 22 fills the contact hole 20. In the step of FIG. 8D, it is also possible to use a CMP process for removing the amorphous silicon film 21 from the part above the silicon oxide film 19.

After the conductive plug 22 is thus formed, a Ti film (not shown) is formed on the silicon oxide film 19 so as to include the plug 22 by a PVD process while using a Ti target, with a thickness of about 20 nm. Further, by conducting a reactive sputtering process on the Ti film while using the same Ti target, a TiN film (not shown) is formed on the Ti film with a thickness of about 50 nm. It should be noted that the Ti film and the TiN film may be omitted, if possible. However, the use thereof is preferable in view of the effect of the TiN film acting as a diffusion barrier against Si in the conductive plug 22 and the effect of the Ti film reducing the contact resistance.

Next, a PVD process is conducted on the structure thus obtained by using an Ir target to deposit a first Ir layer on the interlayer insulation film 19 with a thickness of about 50 nm, followed by a reactive sputtering process conducted in an oxidizing atmosphere while using the same Ir target, to form an $IrO_2$ layer on the first Ir layer with a thickness of about 100 nm. After the $IrO_2$ layer is thus formed, the supply of oxygen is interrupted while continuing the PVD process, and a second Ir layer is formed on the $IrO_2$ with a thickness of about 50 nm. As a result of the foregoing deposition process, a conductive film 23 having a layered structure of Ir/$IrO_2$/Ir/TiN/Ti is formed on the interlayer insulation film 19 as indicated in FIG. 8D.

After the conductive film 23 is thus formed, a PZT film 24 is deposited on the conductive film 23 with a thickness of about 120 nm by an RF sputtering process conducted in an oxidizing atmosphere containing 10–20% of oxygen while using a PZT target as indicated in FIG. 8D.

Figure 8E:
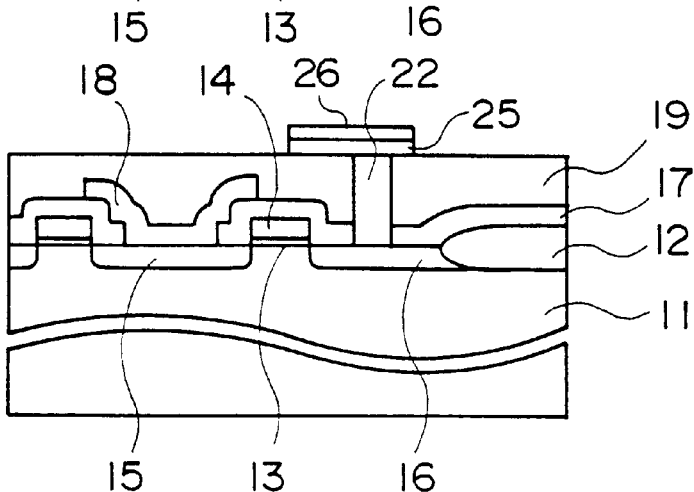

Next, in the step of FIG. 8E, a resist pattern is formed on the PZT film 24 by a well-known photolithographic process, and the PZT film 24 as well as the first and second Ir layers and further the $IrO_2$ layer in the conductive film 23 underneath are patterned by an ion milling process while using the resist pattern as a mask. As a result of the foregoing ion milling process, the PZT film 24 is patterned to form a capacitor insulation film 26 of PZT, and the TiN layer and the Ti layer underneath the patterned Ir-containing layers are exposed. Further, an RIE (reactive ion etching) process is conducted on the exposed Ti and TiN layers by using a mixture of $CH_2Cl$ and $Cl_2$ as an etching gas in conformity with the pattern of the Ir-containing layers and hence the capacitor insulation film 26. Thereby, the conductive film 23 is patterned to form a lower electrode 25. After the patterning of the lower electrode 25, the resist pattern is removed by an ashing process.

Figure 8F:
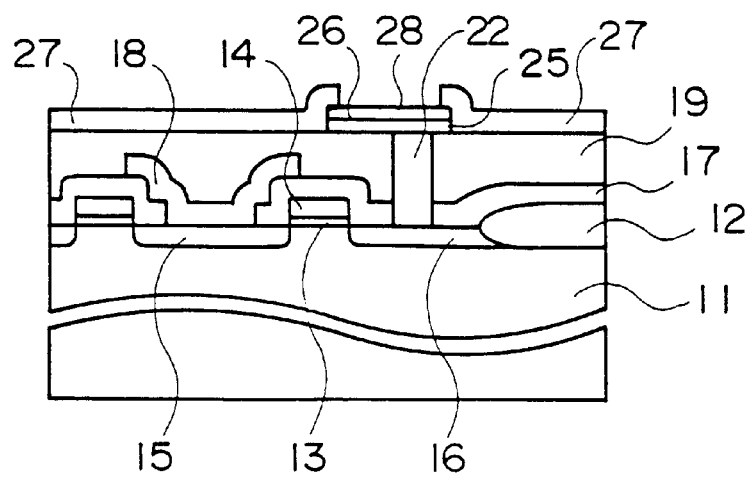
Figure 8G:
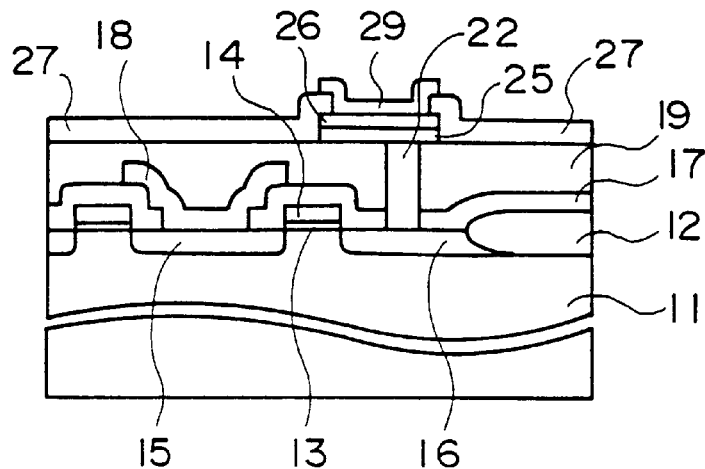

After the lower electrode 25 and the capacitor insulation film 26 are formed as such, an insulation film 27, which may be a silicon oxide film, is deposited on the structure thus obtained by a CVD process as indicated in FIG. 8F, and a contact hole 28 is formed in the silicon oxide film 27 for exposing the PZT capacitor insulation film 26. Further, a Pt film is deposited on the structure thus obtained as indicated in FIG. 8G by a PVD process with a thickness of 50 nm such that the Pt film establishes an intimate contact with the exposed capacitor insulation film 26, followed by a patterning process conducted by an ion milling process to form an upper electrode 29 in contact with the capacitor insulation film 26. Thereby, a memory cell capacitor having a ferroelectric capacitor insulation film is obtained on the interlayer insulation film 19.

Figure 8H:
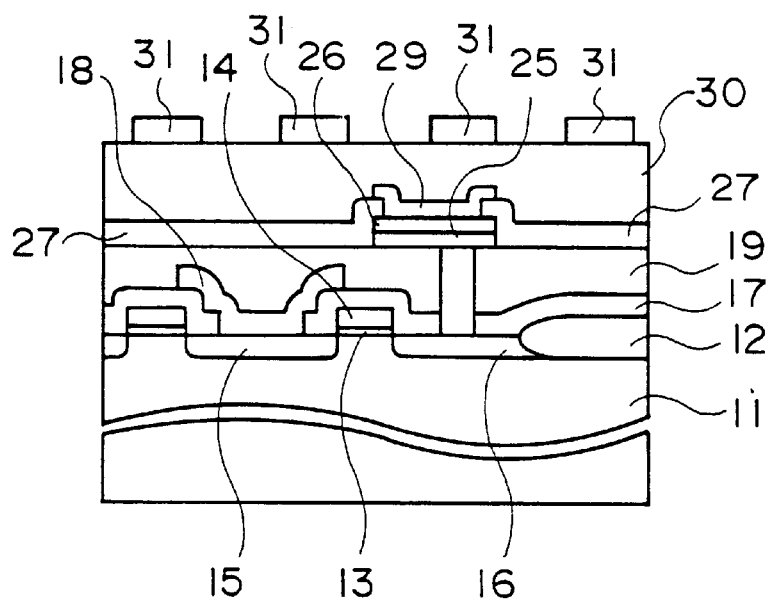

Further, an interlayer insulation film 30 of $SiO_2$ or the like is deposited on the structure of FIG. 8G in the step of FIG. 8H such that the interlayer insulation film 30 covers the memory cell capacitor. By providing interconnection patterns 31 of Al or Al-alloy further on the interlayer insulation film 30 thus formed, the fabrication process of the FRAM of the present embodiment is completed.

As the FRAM of the present embodiment uses the layered structure of $Ir/IrO_2/Ir$ for the lower electrode 25, the problem of oxygen diffusion from the PZT film 26 to the conductive plug 22 during the formation of the PZT layer 24 is successfully eliminated. See the experimental result of FIG. 4. Further, the present embodiment successfully suppresses the diffusion of Pb from the PZT film 26 through the lower electrode 25 by the $IrO_2$ layer.

[Second Embodiment]

Next, the fabrication process of a DRAM according to a second embodiment of the present invention will be described with reference to FIGS. 9A–9G, wherein those parts corresponding to the parts described previously are designated by the same reference numerals and the description thereof will be omitted.

In the present embodiment, a memory cell region is defined on the Si substrate 11 of the p-type by forming the field oxide film 12 similarly as before. Further, the gate insulation film 13 and the gate electrode 14 are formed similarly as before, wherein it should be noted that two such gate electrodes 14 are formed in the illustrated example.

The gate electrode 14 is covered by a silicon oxide film 32 in conformity with the pattern of the gate electrode 14, and the formation of the diffusion regions 15 and 16 is made in the substrate 11 at both sides of the gate electrode 14 while using the gate electrode 14 as a mask. It should be noted that the gate electrode 14 is patterned by using the silicon oxide film 32 as a self-alignment mask.

Figure 9A:
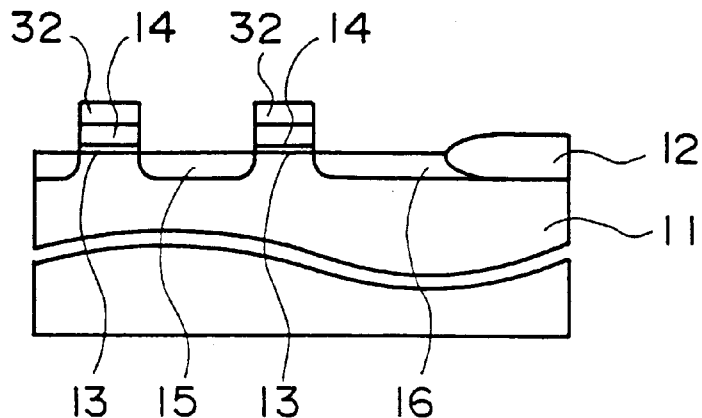
FIGS. 9I–9G are diagrams showing the fabrication process of a DRAM according to a second embodiment of the present invention.
Figure 9B:
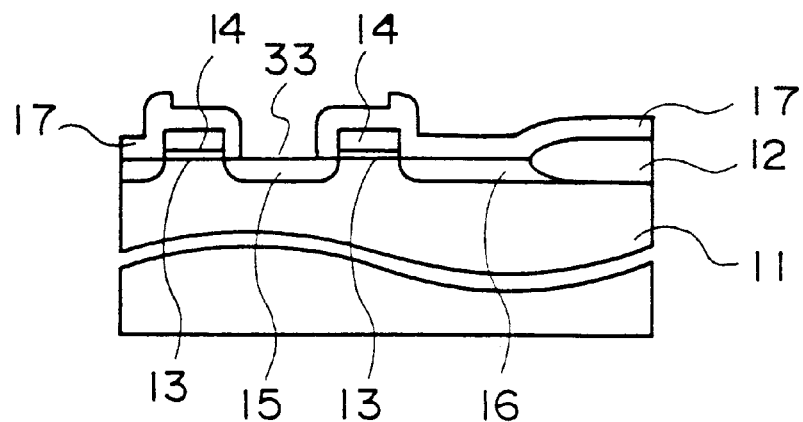

Next, in the step of FIG. 9B, the structure of FIG. 9A is covered by the silicon oxide film 17 similarly as before, and a part of the silicon oxide film 17 corresponding to the diffusion region 15 and the gate electrode 14 is subjected to an anisotropic etching process acting substantially vertically to the substrate 11. As a result of the RIE process, a self-aligned contact hole 33 exposing the diffusion region 15 is formed as indicated in FIG. 9B. It should be noted that the self-aligned contact hole 33 thus formed is characteristically defined by the silicon oxide film 17 covering the side wall of the gate electrode 14.

Figure 9C:
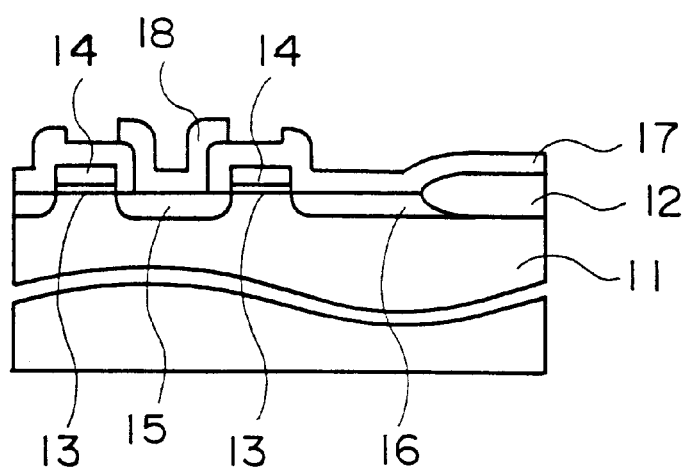

After the step of FIG. 9B, a WSi layer is deposited on the structure of FIG. 9C, followed by a patterning process to form the bit line 18 such that the bit line 18 contacts the exposed diffusion region 15 as indicated in FIG. 9C.

Figure 9D:
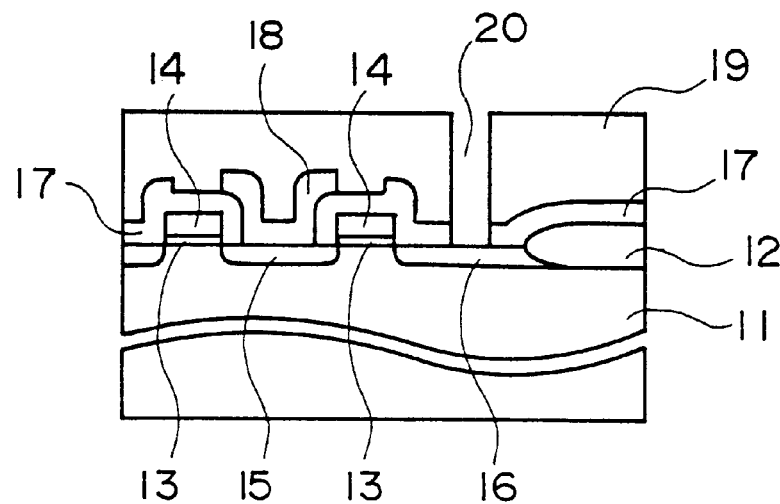

Next, in the step of FIG. 9D, a deposition of the interlayer insulation film 19 is made on the structure of FIG. 9C, followed by a CMP process such that the interlayer insulation film 19 has a planarized top surface. After the planarization of the interlayer insulation film 19, a contact hole 20 is formed in the film 19 such that the contact hole 20 exposes the diffusion region 16.

After the contact hole 20 is thus formed, an amorphous silicon film doped by P to the n-type is deposited on the structure of FIG. 9D by a CVD process similarly to the amorphous silicon film 21 of FIG. 8C, such that the doped amorphous silicon fills the contact hole 20. The amorphous silicon film thus deposited is subsequently removed from the part located above the interlayer insulation film 19, leaving behind the conductive plug 22 of amorphous silicon in the contact hole 20.

Figure 9E:
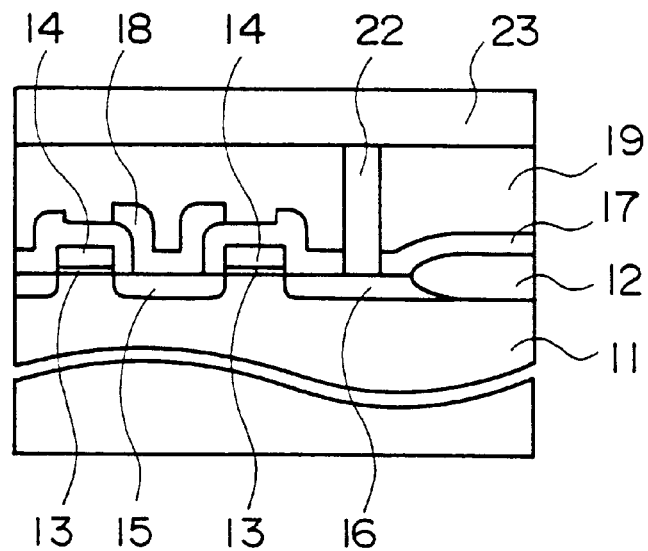

After the conductive plug 22 is thus formed, the formation of the conductive layer 23 is conducted in the step of FIG. 9E, by starting a deposition of a Ti layer with a thickness of about 20 nm by a PVD process using a Ti target. After the formation of the Ti layer, a TiN layer is formed further thereon with a thickness of about 50 nm by a reactive sputtering process conducted in a nitrogen atmosphere while using the same Ti target.

After the TiN layer is thus formed as a part of the conductive film 23, a deposition of a Pt—Ir alloy layer is made on the TiN layer as the remaining part of the conductive film 23 by a PVD process that uses a Pt—Ir alloy target. The deposition of the Pt—Ir alloy is made with a thickness of about 100 nm, and the conductive film 23 thus formed has a layered structure of Pt—Ir/TiN/Ti. It should be noted that the Pt—Ir alloy forming the conductive film 23 may contain Ir with 10 wt % or more. For example, the Pt—Ir alloy may contain Ir with the amount of 10–50 wt % for Ir, wherein it is preferable that the Pt—Ir alloy contains Ir with the amount of about 10 wt %.

After the conductive film 23 is formed as such, the Pt—Ir alloy layer is patterned by an ion milling process while using a resist pattern formed on the film 23 as a mask. After the Pt—Ir alloy layer is thus patterned, the remaining TiN/Ti layered structure is removed from the top surface of the interlayer insulation film 19 while using a mixed gas of $CH_2Cl$ and $Cl_2$ as an etching gas. Thereby, the TiN/Ti layered structure of the conductive film 23 is patterned also in conformity with the shape of the Pt—Ir alloy layer, and the isolated lower electrode 25 having the layered structure of Pt—Ir/TiN/Ti is obtained as indicated in FIG. 9F.

After the lower electrode 25 is formed as such, a BST film is deposited on the top surface of the interlayer insulation film 19 including the lower electrode 25 by an RF sputtering process using a BST target with a thickness of about 180 nm, wherein the RF sputtering is conducted at a substrate temperature of 500–600° C. in an oxidizing atmosphere containing $O_2$ with a concentration level of 10–20%. After the formation of the PVD process, a Pt layer is deposited thereon by a PVD process with a thickness of about 50 nm.

Figure 9F:
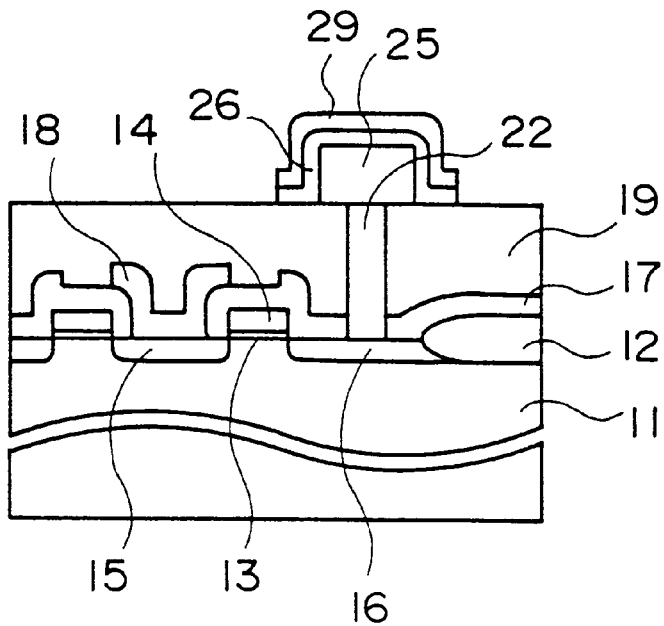

After the Pt layer is thus formed, a resist pattern is formed on the Pt layer to have a shape corresponding to the shape of the capacitor to be formed, and an ion milling process is applied to the Pt layer and further to the underlying BST film while using the resist pattern as a mask, to form the capacitor dielectric film 26 on the lower electrode 25 and the further upper electrode 29 on the capacitor dielectric film 26 thus formed, as indicated in FIG. 9F.

Figure 9G:
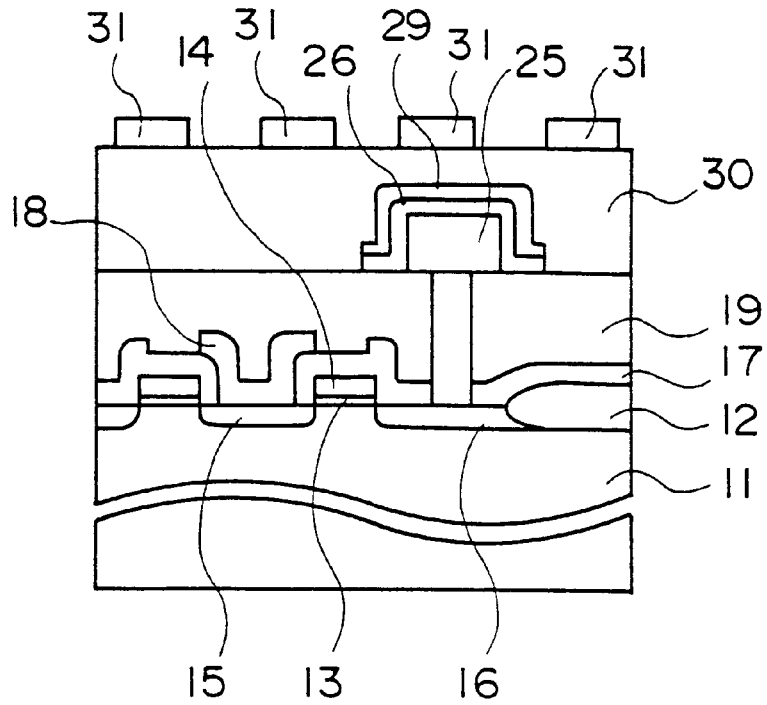

After the structure of FIG. 9F is thus formed, a deposition of the interlayer insulation film 30 is made as indicated in FIG. 9G, and the interconnection patterns 31 of Al or an Al-alloy are formed on the interlayer insulation film 30.

In the DRAM of the present embodiment, it should be noted that the Pt—Ir alloy used in the lower electrode 25 effectively interrupts the diffusion of the oxygen atoms from the BST film 26 to the conductive plug 22, and the problem of oxidation of the surface of the conductive plug 22 is effectively eliminated. Further, the DRAM of the present embodiment uses the Pt—Ir layer in only one layer and is advantageous in the points of a reduced number of the fabrication steps and reduced consumption of the Ir resource.

In the DRAM of the present embodiment, it is of course possible to use a SiN-spacer self-aligned contact structure that uses a SiN film for the side wall of the gate electrode 14 when forming the self-aligned contact hole 33 (see FIG. 9B), rather than using the $SiO_2$ side wall.

In the first and second embodiments described heretofore, it should be noted that the layered structure of $Ir/IrO_2/Ir$ described with reference to the first embodiment is effective also in the second embodiment as a replacement of the Pt—Ir alloy layer in the lower electrode 25. Further, it should be noted that the material for the capacitor dielectric film 26 is by no means limited to BST, but other double oxides such as a high-permittivity dielectric material may also be used.

When using the $Ir/IrO_2/Ir$ structure described before, it should be noted that the upper Ir layer functions to align the crystal orientation of the PZT film provided thereon. When the PZT film 26 is deposited directly on the $IrO_2$ layer, which is a polycrystalline film with no definite orientation in the crystals, the crystal orientation of the PZT film 26 thus deposited becomes irregular, and a deterioration tends to occur in the property of the PZT film 26 such as an increased leakage current or fatigue of ferroelectricity. The Ir layer deposited on the $IrO_2$ layer shows an alignment of crystal orientation and thus induces the desired crystal orientation in the PZT film deposited thereon. In other words, the upper Ir layer of the $Ir/IrO_2/Ir$ electrode structure plays an important role in the FRAM.

In the case of using the structure of FIG. 8H for a DRAM by providing a BST dielectric film in place of the ferroelectric PZT film 26, on the other hand, it is possible to omit the upper Ir layer in the lower electrode 25. On the other hand, the lower Ir layer of the $Ir/IrO_2/Ir$ structure functions to avoid the oxidation of the underlying layer such as the TiN or Si layer during the growth of the $IrO_2$ film. This in turn means that it is possible to omit the lower Ir layer when the deposition of the $IrO_2$ film does not cause an oxidation in the conductor layers underneath the lower electrode or when such an oxidation does not provide an adversary effect on the device characteristics.

In the opposite case of using the Pt—Ir alloy of the second embodiment in the FRAM of the first embodiment, it was also discovered that the Pt—Ir alloy functions not only as an efficient diffusion barrier against oxygen atoms but also as an efficient diffusion barrier against Pb atoms. In other words, the Pt—Ir alloy of the second embodiment can be used also for the lower electrode 25 of the FRAM of FIG. 8H on which the PZT film 26 is deposited.

According to the experiment of the inventor conducted on the PZT/Pt—Ir system in which a PZT film is formed on a Pt—Ir alloy layer, it was discovered that the concentration of the Ir atoms increases at the interface between the PZT film and the Pt—Ir alloy layer, while the concentration of the Pt atoms decrease at the same interface. In other words, there occurs an accumulation of Ir atoms at the PZT/Pt—Ir interface. Thus, there is a substantial possibility that the Ir atoms thus accumulated experience oxidation at the time of the deposition of the PZT film, and there occurs a formation of an $IrO_2$ film at such an interface as a result of the oxidation of Ir. The $IrO_2$ film thus formed effectively blocks the diffusion of Pb atoms similarly to the case of the $Ir/IrO_2/Ir$ structure of the first embodiment.

Further, it should be noted that other elements such as Ru can be used for the same purpose in place of Ir in the first and second embodiments, except that the use of Ru provides only a limited effect for blocking the diffusion of the Pb atoms, as $RuO_2$, which is expected to be formed at the Pt—Ru/PZT interface, is not an effective diffusion barrier against Pb atoms. As long as a compound containing Pb is used for the dielectric film 26, it is desired to use the electrode structure that contains Ir or an Ir alloy as mentioned previously.

In the foregoing embodiments, it should be noted that the patterning of the Ir or Pt electrode was made by an ion milling process, as there is no known compound for Ir or Pt that shows a sufficiently high vapor pressure necessary for removal by way of a dry etching process. On the other hand, it is possible to use $O_2$ as an etching gas when patterning a Ru or $RuO_2$ electrode by a dry etching process. It should be noted that $RuO_4$ is formed as a gaseous product with a high vapor pressure when Ru or $RuO_2$ is oxidized. When $O_2$ is used for the etching gas, it should be noted that an oxide mask has to be used in place of the resist mask.

[Third Embodiment]

As noted previously, it is possible to pattern the electrode by a dry etching process using an $O_2$ etching gas when the electrode is formed of Ru or $RuO_2$. During such a patterning process, it is necessary to use an oxide mask pattern.

However, the use of such an oxide mask pattern causes a problem of oxidation of the Ru or $RuO_2$ layer at the time of the formation of the oxide mask, while the Ru or $RuO_2$ layer thus having experienced an oxidation tends to show a rough surface. It should be noted that the Ru or $RuO_2$ film is a polycrystalline film formed of crystal grains having different crystal orientations, while the oxidation rate changes depending on the crystal surfaces of the crystal grains exposed at the surface of the layer. When Ru or $RuO_2$ layer having a rough surface is used for the lower electrode of the memory cell capacitor, there is a risk that the memory cell capacitor may leak due to the concentration of the electric field induced by the rough electrode surface. Further, such a process of patterning the Ru or $RuO_2$ layer by using an oxide mask requires a subsequent process of removing the oxide mask, while such a subsequent process increases the number of fabrication steps and hence the cost of the device.

Figure 10A:
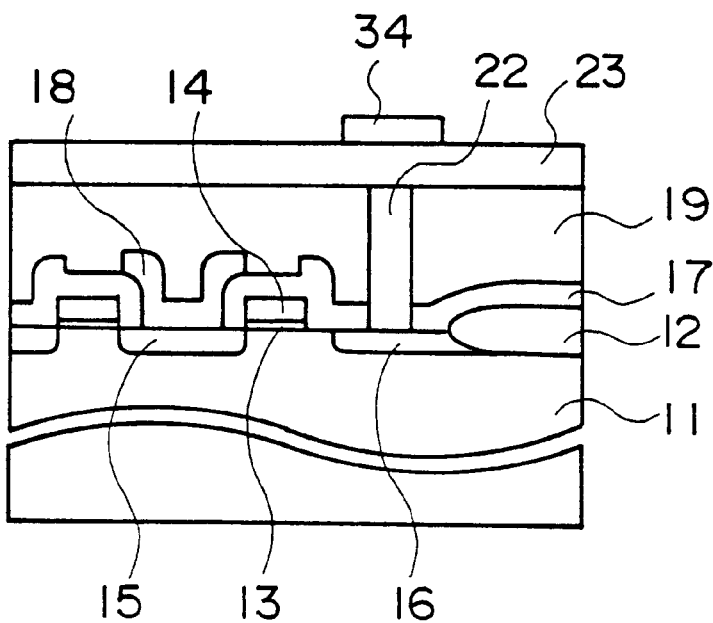
FIGS. 10A and 10B are diagrams showing the fabrication process of a semiconductor memory device, which may be either of a FRAM or a DRAM according to a third embodiment of the present invention.
Figure 10B:
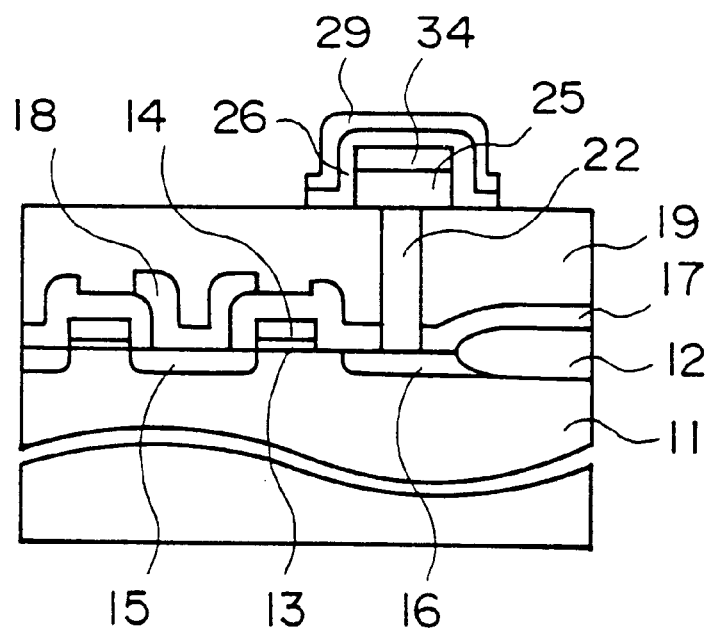

In order to eliminate the foregoing problem, the present embodiment proposes a process as indicated in FIGS. 10A and 10B, in which those parts described previously are designated by the same reference numerals and the description thereof will be omitted.

Referring to FIG. 10A, the conductive film 23 of the present embodiment includes a layered structure of Ru/RuO$_2$/Ru/TiN/Ti in place of the Pt—Ir/TiN/Ti structure of the second embodiment, and a Pt mask 34 is provided on the conductive film 23 in correspondence to the lower electrode 25 to be formed as a result of the patterning of the conductive film 23. The Pt mask 34 may be formed by a deposition of a Pt layer by a PVD process, followed by a patterning process conducted by an ion milling process while using a resist mask.

After the Pt mask 34 is thus formed, the conductive film 23 is subjected to an RIE process while using O$_2$ as an etching gas, to pattern the Ru/RuO$_2$/Ru structure in the film 23 selectively. Further, the etching as is changed to a mixture of CH$_2$Cl and Cl$_2$, and the patterning of the remaining structure of TiN/Ti is carried out to form the lower electrode 25.

After the lower electrode 25 is thus formed, the capacitor insulation film 26 and the upper electrode 29 are formed similarly as before as indicated in FIG. 10B. As already noted, the capacitor insulation film 26 may be formed of a double oxide film such as BST, STO or PZT.

According to the feature of the present embodiment, it is possible to pattern the lower electrode by an O$_2$ dry etching gas while using Pt as an etching mask. As the Pt mask 34 is a conductive mask, it can be used as a part of the lower electrode 25, and the process of removing the mask can be eliminated. It should be noted that the material for the mask 34 is not limited to Pt but any conductive material that is chemically stable against the reaction of O$_2$ may be used.

In the foregoing Ru/RuO$_2$/Ru structure of the lower electrode 25, it should be noted that the upper Ru layer, on which the double oxide film is deposited for the capacitor insulation film, acts to align the crystals in the deposited double oxide film, similarly to the case of the Ir/IrO$_2$/Ir structure explained before. Thus, the structure of the present invention is particularly useful for a FRAM that stores the information in the form of polarization of the capacitor insulation film 26.

Further, it should be noted that one can use an Ir alloy in place of the Ru alloy in the present embodiment. Further, it should be noted that the deposition of the layers of Ir, IrO$_2$, Ru or RuO$_2$ is not limited to the PVD process as noted but the deposition of these layers may be made also by a CVD process.

Further, the double oxide film used in the present invention for the capacitor insulation film is not limited to BST or PZT but other materials such as STO, SrBi$_2$(Nb, Ta)$_2$O$_3$, Pb(Zr, Ti)O$_3$, (Pb, Ln)(Zr, Ti)O$_3$, and the like may also be used.

Further, the present invention is not limited to the embodiments described heretofore, but various variations and modifications may be made without departing from the scope of the invention.

What is claimed is:

1. A method of fabricating a semiconductor memory device, comprising the steps of:

forming a metal-insulator-semiconductor transistor on a substrate such that said metal-insulator-semiconductor transistor includes a gate electrode connected to a word line and first and second diffusion regions formed in said substrate at both sides of said gate electrode and such that said first diffusion region is connected to a bit line;

providing an interlayer insulation film on said substrate so as to cover said metal-insulator-semiconductor transistor;

forming a contact hole in said interlayer insulation film so as to expose said second diffusion region;

filling said contact hole by a conductive plug;

depositing consecutively a layer of an Ir alloy and a layer of an oxide of said Ir alloy on said interlayer insulation film so as to cover said conductive plug;

patterning said layer of Ir alloy and said layer of oxide of said Ir alloy to form a lower electrode pattern;

depositing an insulation film on said lower electrode pattern;

patterning said insulation film to form a capacitor insulation film;

depositing a conductor layer on said capacitor insulation film; and patterning said conductor layer to form an upper electrodes, wherein said step of patterning said lower electrode pattern is conducted by a dry etching process conducted in an oxygen atmosphere while using a mask pattern of Pt.

2. The method as claimed in claim 1, wherein said step of depositing the insulation film on said lower electrode pattern includes a step of depositing either a film of a ferroelectric material or a dielectric material.

3. The method as claimed in claim 1 further including a step of depositing an Ir layer on said IrO$_2$ layer as a part of said lower electrode pattern.

4. The method as claimed in claim 1, wherein said step of patterning said Ir layer and said IrO$_2$ layer is conducted by using a mask pattern used commonly in said step of patterning said insulation film.

5. The method as claimed in claim 1, wherein said step of patterning said capacitor insulation film is conducted by using a mask pattern used commonly in said step of patterning said upper electrode.

* * * * *